United States Patent
Kwon

(10) Patent No.: US 6,642,662 B2
(45) Date of Patent: Nov. 4, 2003

(54) PLASMA APPARATUS

(75) Inventor: Tae-Kyun Kwon, Kwangju (KR)

(73) Assignee: Jusung Engineering Co. Ltd. (KR)

( * ) Notice: Subject to any disclaimer, the term of this patent is extended or adjusted under 35 U.S.C. 154(b) by 0 days.

(21) Appl. No.: 10/282,305

(22) Filed: Oct. 28, 2002

(65) Prior Publication Data

US 2003/0085661 A1 May 8, 2003

(30) Foreign Application Priority Data

Nov. 2, 2001 (KR) .................................. 2001-0068095

(51) Int. Cl.$^7$ .................................................. H01J 7/24
(52) U.S. Cl. ........................ 315/111.21; 118/723 E; 156/345.37; 156/345.43
(58) Field of Search ................. 315/111.21; 118/723 E; 156/345.43, 345.37, 345.33, 345.35

(56) References Cited

U.S. PATENT DOCUMENTS

| | | | | |
|---|---|---|---|---|
| 4,842,683 A | * | 6/1989 | Cheng et al. | 156/345.37 |
| 5,628,829 A | * | 5/1997 | Foster et al. | 118/723 E |
| 5,716,870 A | * | 2/1998 | Foster et al. | 438/675 |
| 5,866,213 A | * | 2/1999 | Foster et al. | 427/573 |
| 6,524,430 B1 | * | 2/2003 | Shim et al. | 156/345.43 |

* cited by examiner

Primary Examiner—Hoang Nguyen
Assistant Examiner—Thuy Vinh Tran
(74) Attorney, Agent, or Firm—Ostrolenk, Faber, Gerb & Soffen, LLP

(57) ABSTRACT

A plasma apparatus is disclosed, wherein an RF feed through having a stick type not a wire type is used. Accordingly, even if heat is generated at the RF feed through by an applied RF, heat is more easily emitted outwardly than at the conventional wire type. According to this, an impedance of the RF feed through is least changed by heat, thereby having a reliability of a process. Also, since the RF feed through is formed at an upper portion of the plasma chamber not at a lateral side, the RF feed through unit including a cooling jacket and an air cooling jacket is easily engaged to the plasma apparatus. In addition, since an outer upper portion of the bell jar is flat, when the RF feed through penetrates an upper center of the bell jar, an area of a contacted part of the RF feed through with the bell jar becomes minimum, thereby having less influence by a bell jar heater.

5 Claims, 1 Drawing Sheet

PLASMA APPARATUS

BACKGROUND OF THE INVENTION

1. Field of the Invention

The present invention relates to a plasma apparatus, and more particularly to a plasma apparatus which improves an RF feed through installed to apply RF power to a plasma electrode.

2. Description of the Background Art

In general, the conventional plasma apparatus has a problem that an RF feed through to which RF is applied has a short life span. A Kanthal wire is generally used as the RF feed through. However, the RF feed through composed of the Kanthal wire is oxidized or phase-transformed when exposed in high temperature for a long time since the Kanthal wire is a wire type.

FIG. 1 is a schematic view to explain a plasma apparatus in accordance with the conventional art. Referring to FIG. 1, a plasma electrode 20 of stainless material is installed at an upper portion of a quartz dome 10 above a plasma chamber to cover the quartz dome 10. At this time, the plasma electrode 20 has a dome shape like the quartz dome 10 and is apart from the quartz dome 10 with a predetermined interval. A bell jar 30 is installed to cover the plasma electrode 20, and an outer upper portion of the bell jar generally has a flat shape. An RF feed through 50 of a wire type penetrates a lateral side of the bell jar 30 and is connected to the plasma electrode 20. Then, RF power passes through an RF connector 40 and the RF feed through 50 sequentially and is supplied to the plasma electrode 20.

According to the conventional plasma apparatus, when RF is applied to the RF feed through 50, a lot of heat is generated since the RF feed through 50 is a wire type. Accordingly, the RF feed through 50 is easily oxidized or phase-transformed, thereby changing an impedance of the RF feed through 50. Also, the bell jar 30 is generally provided with a bell jar heater (not shown) to heat the plasma chamber. At this time, the impedance of the RF feed through 50 is more changed by the bell jar heater. If the impedance of the RF feed through 50 is changed, the RF power applied to the plasma electrode 20 is not constant, thereby degrading a reliability of a process.

SUMMARY OF THE INVENTION

Therefore, an object of the present invention is to provide a plasma apparatus which has a constant impedance even if an RF feed through is exposed in high temperature for a long time.

To achieve these and other advantages and in accordance with the purpose of the present invention, as embodied and broadly described herein, there is provided a plasma apparatus comprising a plasma chamber formed as a quartz dome at an upper portion thereof and having a gas inlet and a gas outlet; a plasma electrode apart from the quartz dome with a constant interval and having a dome shape like the quartz dome to cover the quartz dome; a bell jar installed to cover the plasma electrode; and an RF feed through of a stick type installed to vertically penetrate an upper portion of the bell jar so as to be connected to a peak of a center of the plasma electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
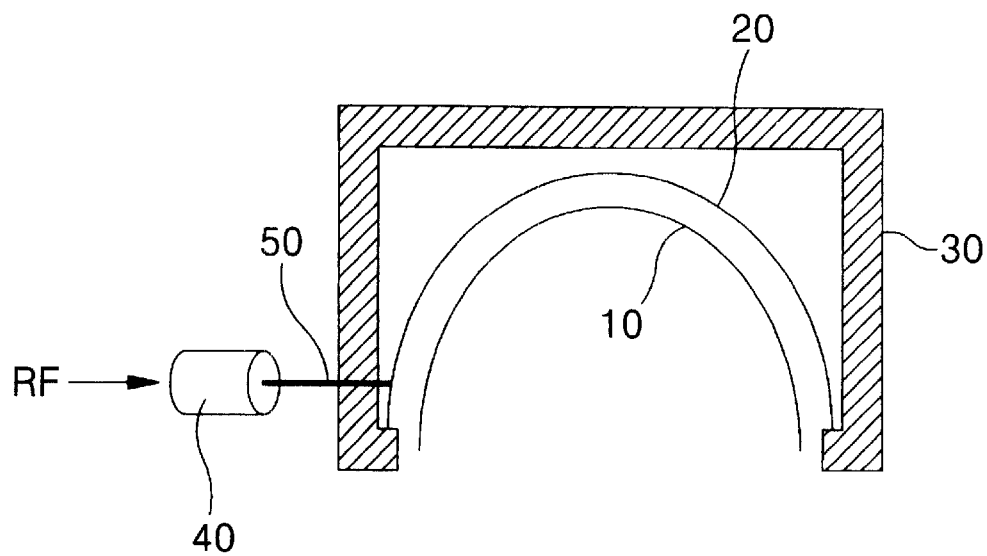
FIG. 1 is a schematic view to explain a plasma apparatus in accordance with the conventional art.
Figure 2:
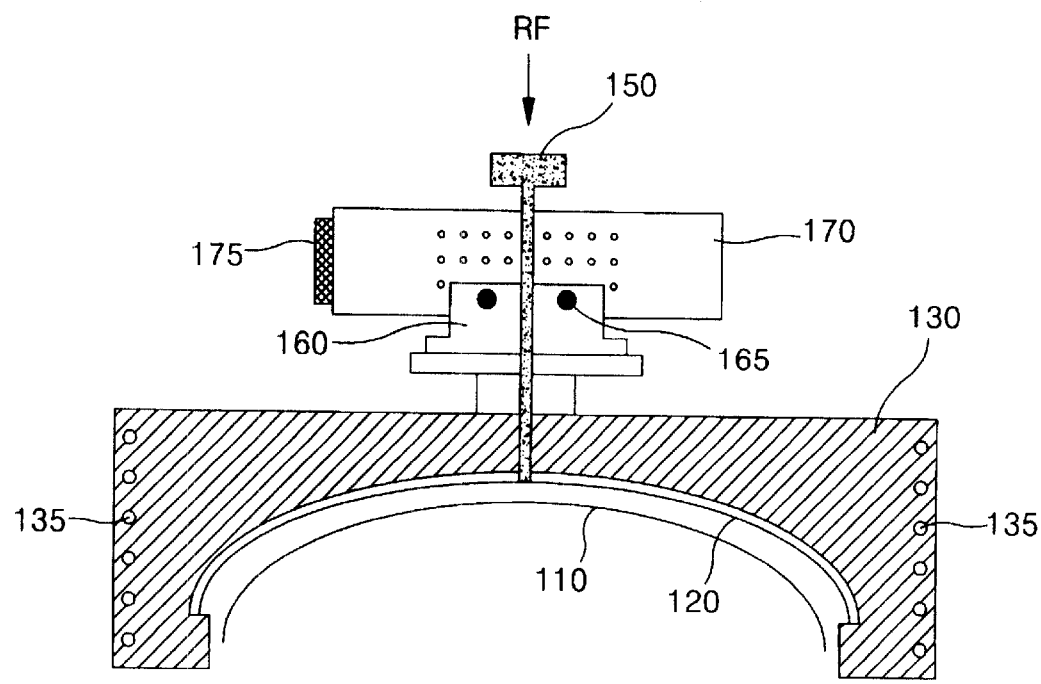
FIG. 2 is a schematic view to explain a plasma apparatus according to the present invention.

FIG. 2 is a schematic view to explain a plasma apparatus according to one embodiment of the present invention.

Referring to FIG. 2, a plasma chamber formed as a quartz dome 110 at an upper portion thereof and having a gas inlet (not shown) and a gas outlet (not shown). The bell jar 130 installed to cover the quartz dome 110 has an inner wall apart from the quartz dome 110 with a constant interval and having the same dome shape with the quartz dome 110. An outer shape of the bell jar 130 is a cylindrical one. The bell jar 130 is provided with a bell jar heater 135 to heat the plasma chamber. A plasma electrode 120 is installed between the bell jar 130 and the quartz dome 110. The bell jar 130 is apart from the quartz dome 110 with a constant interval and has a dome shape to cover the quartz dome 110.

An RF feed through 150 is installed from outside to vertically penetrate an upper portion of the bell jar 130 so as to be connected to a peak of a center of the plasma electrode 120 having a dome shape. The RF feed through 150 is a stick type differently from the conventional art. The RF feed through 150 is a stick type having a thickness of 7~10 mm or a length of 90~110 mm.

Since the bell jar 130 has a flat form at an outer upper portion, the bell jar 130 has the thinnest thickness at a center. Accordingly, if the RF feed through 150 penetrates an upper center of the bell jar 130 and is connected to a peak of a center of the plasma electrode 120, an area of a contacted part of the RF feed through 150 with the bell jar 130 becomes minimum. Therefore, the RF feed through is less influenced from the bell jar heater 135.

The RF feed through 150 is surrounded by a cooling jacket 160 at an outer portion of the bell jar 130. The cooling jacket 160 is provided with a cooling line 165 in which cooling water flows. An air cooling jacket 170 for covering the RF feed through 150 is installed at an upper portion of the cooling jacket 160. The air cooling jacket 170 is provided with a fan 175 for air-cooling the RF feed through.

As aforementioned, in the present invention, since the RF feed through 150 of a stick type is used, even if heat is generated at the RF feed through 150 by an applied RF, heat is more easily emitted outwardly than at the conventional RF feed through of a wire type. Accordingly, an impedance of the RF feed through is least changed by heat, thereby having a reliability of a process.

Also, since the RF feed through 150 is formed at an upper portion of the plasma chamber not at a lateral side, the RF feed through 150 unit including the cooling jacket 160 and the air cooling jacket 170 is easily transported, thereby engaging the unit to the plasma apparatus easily.

In addition, since an outer upper portion of the bell jar 130 is flat, when the RF feed through 150 penetrates an upper center of the bell jar 130, an area of an exposed part of the RF feed through 150 to the bell jar 130 becomes minimum, thereby having less influence by the bell jar heater 135.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A plasma apparatus comprising:
   a plasma chamber formed as a quartz dome at an upper portion thereof and having a gas inlet and a gas outlet;
   a plasma electrode apart from the quartz dome with a constant interval and having a dome shape like the quartz dome so as to cover the quartz dome;
   a bell jar installed to cover the plasma electrode; and
   an RF feed through of a stick type installed to vertically penetrate an upper portion of the bell jar so as to be connected to a peak of a center of the plasma electrode.

2. The plasma apparatus of claim 1, wherein the RF feed through is a stick type having a thickness of 7~10 mm.

3. The plasma apparatus of claim 1, wherein the RF feed through is a stick type having a length of 90~110 mm.

4. The plasma apparatus of claim 1, wherein a cooling line is installed to surround the RF feed through at an outer portion of the bell jar.

5. The plasma apparatus of claim 1, wherein an outer upper portion of the bell jar is flat.

* * * * *